US006307797B1

(12) United States Patent
Fournel et al.

(10) Patent No.: US 6,307,797 B1
(45) Date of Patent: Oct. 23, 2001

(54) READING DEVICE FOR INTEGRATED CIRCUIT MEMORY

(75) Inventors: Richard Fournel, Lumbin (FR); Laura Varisco, Cernusco Lombardone (IT)

(73) Assignee: STMicroelectronics S.A., Gentilly (FR)

(*) Notice: Subject to any disclaimer, the term of this patent is extended or adjusted under 35 U.S.C. 154(b) by 0 days.

(21) Appl. No.: 09/724,260

(22) Filed: Nov. 28, 2000

(30) Foreign Application Priority Data

Nov. 30, 1999 (FR) .................................................. 99 15114

(51) Int. Cl.[7] .................................................... G11C 7/00
(52) U.S. Cl. ...................... 365/203; 365/210; 365/185.21
(58) Field of Search ................................... 365/203, 207, 365/210, 185.21, 185.25

(56) References Cited

U.S. PATENT DOCUMENTS

| 4,974,207 | * | 11/1990 | Hashimoto | 365/210 |
| 5,282,169 | * | 1/1994 | Pascucci et al. | 365/210 |
| 5,321,660 | * | 6/1994 | Sani et al. | 365/210 |
| 5,528,543 | * | 6/1996 | Stiegler | 365/207 |
| 5,539,694 | * | 7/1996 | Rouy | 365/210 |

FOREIGN PATENT DOCUMENTS

| 0514350 | 11/1992 | (EP) | G11C/16/06 |
| 0828253 | 8/1996 | (EP) | G11C/7/06 |
| 0872849 | 10/1998 | (EP) | G11C/16/06 |

OTHER PUBLICATIONS

Terada et al., High Speed Page Mode Sensing Scheme for EPROMS and Flash EEPROMS using Divided Bit Line Architecture, Symposium on VLSI Circuits, US, New York, IEEE, vol. Symp. 4, Jun. 7, 1990, pp. 97–98.

* cited by examiner

Primary Examiner—Tan T. Nguyen
(74) Attorney, Agent, or Firm—Lisa K. Jorgenson; Allen, Dyer, Doppelt, Milbrath & Gilchrist, P.A.

(57) ABSTRACT

A device for reading a memory including precharging circuits for precharging the inputs of a differential amplifier to a precharging voltage. The precharging voltage may be at an intermediate voltage level between a precharging voltage level of the bit lines and the voltage level of the logic supply voltage. This provides for a very fast build-up, during a following evaluation phase, of the output of the amplifier in a state corresponding to that of the cell being read. An internal detection circuit may also be included to detect an end of the precharging to stop the precharging circuit and activate the read current generator for the evaluation phase.

35 Claims, 3 Drawing Sheets

READING DEVICE FOR INTEGRATED CIRCUIT MEMORY

FIELD OF THE INVENTION

The present invention relates to the field of electronic circuits, and, more particularly, to reading devices for integrated circuit memories. The present invention may be applied especially, but not exclusively, to erasable programmable read only memories (EPROMs) or one-time-programmable (OTP) type non-volatile electrically programmable memories.

BACKGROUND OF THE INVENTION

The cells of a memory are usually organized in matrix form with bit lines and word lines. The bit lines are the conductors through which the state stored in a cell is read. Thus, when a memory cell is addressed in read mode, the corresponding word line is selected and the corresponding bit line is connected to a read device.

In general, it is not just one but several memory cells that are read when a memory word is read. The cells forming a memory word typically belong to the same word line, and a respective bit line corresponds to each cell. In read mode, each one of these bit lines is connected to a corresponding reading device, where all of the reading devices may be identical.

Since the bit lines include a large number of cells, they provide capacitance because of the sum of the individual capacitances of the components themselves, namely the cells and selection transistors, and because of the topology of the bit lines. They also provide resistance because of the materials used, the contact resistances, the metallization, and the internal resistances of the transistors of the cells.

For these reasons, the reading device usually includes a precharging circuit to charge the equivalent capacitor of a bit line selected in read mode to a determined precharging read voltage. Then, a current generator sets up a current in the bit line. If the selected cell absorbs current, a voltage variation will be detected on the line. In the case of EPROM type memory cells, the reading device furthermore includes a voltage limiter to limit the voltage of the bit lines to a level close to one volt. This is to eliminate the risk of memory cells being programmed during the read access operations.

In addition, the reading is often based on a comparison between the current that flows in the cell selected in read mode and the current that flows in a reference cell. For example, in the case of an EPROM or OTP memory, the two possible states of a cell of the memory are the blank state (which is also the state of being erased by UV rays) and the programmed state. The reference cells are all in the same known state, which is generally the blank state. In this state, the floating-gate transistor of the memory cell has a low threshold voltage of about 1.4 volts, for example. In the programmed state, this threshold voltage becomes higher (e.g., 5.5 volts).

The principle of a reading relying on a comparison is based on the fact that if the cell selected in read mode is in the erased state, it can absorb as much current as the reference cell placed in the same conditions of bias. If this cell is provided with only a fraction of this current, it will make the bit line voltage collapse, and this fact will be detected.

Thus, in practice, a read current generator injects a given read current Iref into the reference bit line associated with the reference cell. It also injects a fraction of this reference current (e.g., half or one-third) into the data bit line associated with the cell to be read. A read differential amplifier receives a signal coming from the data bit line at the first differential input and a signal coming from the reference bit line at the second differential input.

If the cell that is read is erased, it draws more current than the fraction of reference current given to it by the current generator. The first differential input is then drawn to a voltage U lower than the voltage Uref at the second input of the differential amplifier. The output of the amplifier switches over in one direction. If, on the other hand, the cell that is read is programmed, it absorbs very low current or no current at all. The first differential input is then drawn to a voltage U higher than the voltage Uref at the second input of the differential amplifier and the output of the amplifier switches over to the other direction.

Thus, a common reading device includes a precharging circuit for each of the bit lines that limits the bit line voltage, a read current generator connected to the bit lines, and a read amplifier that provides the information at the output. The precharging circuit is in practice a current/voltage converter that fulfils three different functions. The first function is supplying current to precharge the bit lines. The second function is limiting the bit line potential to a specified precharging read voltage to eliminate involuntary programming. Furthermore, the third function is supplying a signal to the amplifier, with a voltage that varies strongly with the current on the associated bit line, in the evaluation stage.

The reading device therefore goes through several stages of operation. These include starting up the precharging circuits, activation of the read current generators, selection and precharging of the bit lines, and selection of the word line (row decoding). The voltage levels seen by the read amplifier are then often close to Vdd and are related not to the state of the selected cell but to the precharging circuit.

At this time, the cell selected in read mode either absorbs or does not absorb current. If current is absorbed (in the case of a blank or erased cell), this current is first given by the bit line capacitance and then by the associated read current generator. This absorption of current produces a great variation of voltage in the signal applied at the input to the differential amplifier, causing it to switch over. Even so, the output of the amplifier oscillates throughout the time of the variations on the bit lines. This slows down the setting up of the real data at the output.

In practice, the sequencing operations needed to start up the various circuits of the reading device and the parasitic oscillations of the amplifier lengthen the read access time. One and one-half clock cycles are needed to obtain the output data element. By way of example, a typical read access time may be 80 nanoseconds, and a maximum read access time may be 130 nanoseconds.

To avoid oscillations at the output of the amplifier, reading devices may use a latch instead of the read differential amplifier. Yet, it is then necessary to provide an additional external sequencing. This is to provide the activation signal for this latch as a function of all the time constraints and as a function of the sensitivity of the latch. This activation signal often comes from a control unit using reference circuits known as "dummy" circuits in the art. These circuits are sized to obtain sufficient latitude, allowing for the worst cases of propagation. In the prior art, the reading is slowed down because of the successive sequencing operations needed and the oscillation of the amplifier.

SUMMARY OF THE INVENTION

It is an object of the present invention to reduce the read access time of memories, namely the time in which the data reflecting the state stored in one or more memory cells becomes available at an output. In one example, a maximum read access time of 25 nanoseconds may be provided instead of the typical prior art time of 80 nanoseconds.

Another object of the invention is to provide a fast-access reading device for a memory using a differential amplifier.

A reading device according to the present invention includes, in addition to a circuit for precharging data bit lines and reference bit lines to a precharging voltage level close to one volt, a circuit for precharging inputs of an amplifier to an intermediate precharging voltage level between the precharging voltage level (e.g., on the order of one volt) and the level of the supply voltage Vdd. In practice, this value is about 1.5 volts and balances the inputs of the differential amplifier. As such, in the next evaluation phase, the output of the amplifier switches over very quickly into one logic state or the other, depending on the state stored in the cell on the selected bit line.

Thus, according to the present invention, the data and reference bit lines are precharged to a precharging read voltage of nearly one volt. This precharging is done in combination with a precharging of the inputs of the amplifier to an intermediate voltage level.

The invention also relates to a reading device for an integrated circuit memory including a differential amplifier having one input connected to an output of a first current/voltage converter connected at an input to a selected data bit line. The selected data bit line may include a cell of the memory to be read. Another output of the differential amplifier may be connected to an output of a second current/voltage converter connected at an input thereof to a selected reference bit line. The selected reference bit line may include a reference cell. Each converter may be used to precharge the associated bit line to a first precharging voltage in a precharging phase.

The reading device may furthermore include a read current generator to provide a current on each of the data bit and reference bit lines. This enables setting up of the data element at an output of the device in an evaluation phase. The reading device may further include a circuit for precharging inputs of the differential amplifier. The inputs are precharged to a second precharging voltage at an intermediate level between the first precharging voltage and the logic supply voltage Vdd during the precharging phase.

BRIEF DESCRIPTION OF THE DRAWINGS

Various characteristics and advantages of the invention are described in detail in the following description, given by way of a non-limitative example, with reference to the appended drawings, in which.

In the following description, a signal and its voltage are sometimes designated by the same reference for convenience.

DETAILED DESCRIPTION OF THE PREFERRED EMBODIMENTS

Figure 1:
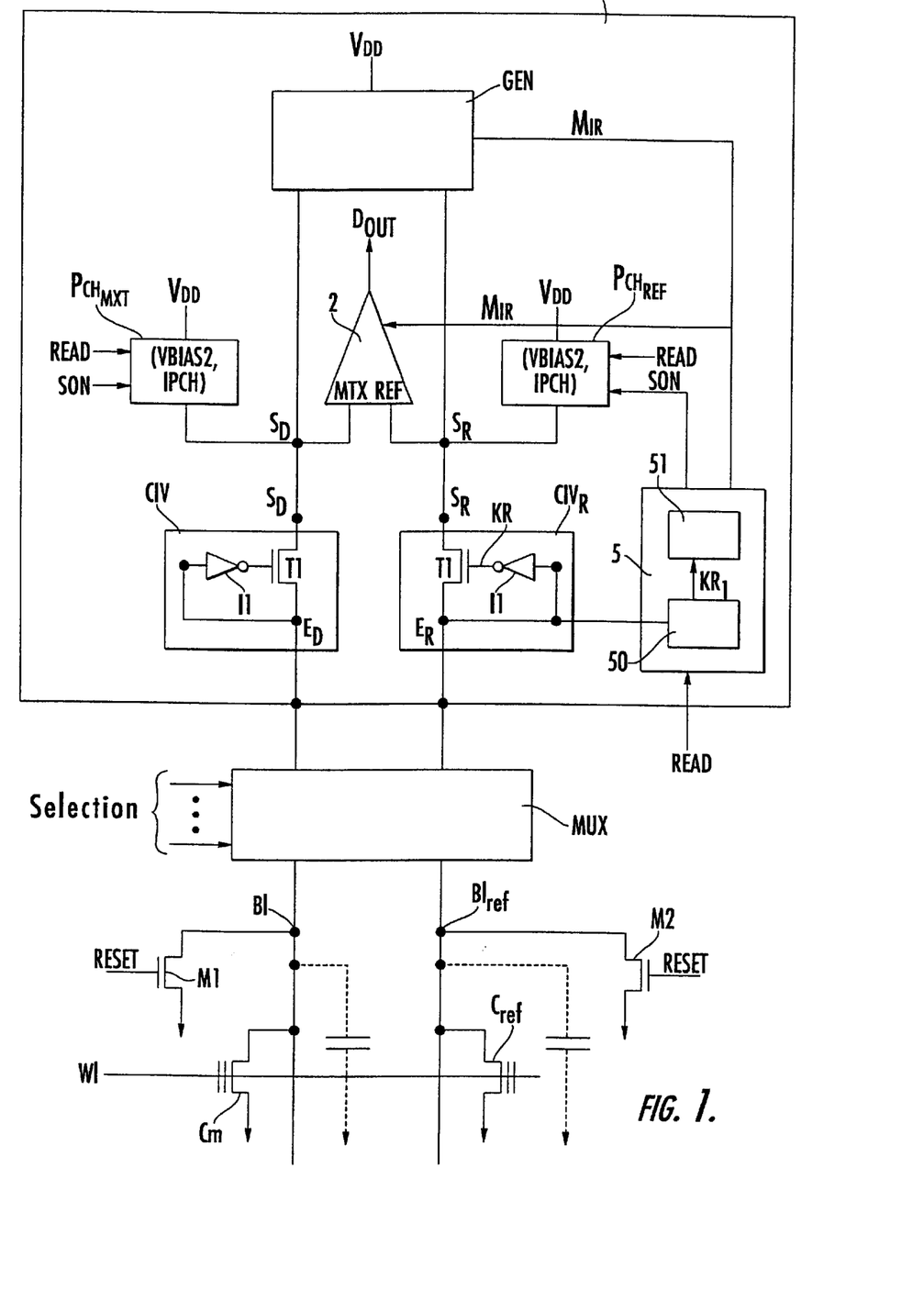
FIG. 1 is a schematic block diagram of a reading device according to the present invention for reading cells of a memory.

FIG. 1 is a block diagram of a reading device according to the present invention for reading cells of a memory. In the illustrated example, the memory is an EPROM type memory. A cell of this memory includes a floating-gate transistor having its drain connected to a bit line of the memory array and its gate connected to a word line. The reference cell or cells are generally located on a reference bit line at the end of the memory array.

The complexity of the architecture of the memory may vary. The architecture may or may not include access transistors. It may include a grouping of bit lines or other lines, and the memory may be of some other type (e.g. non-volatile, etc.). The invention thus applies to numerous types and architectures of memories.

A data bit line B1 and a reference bit line $Bl_{ref}$ of the memory may be seen in FIG. 1. A memory cell Cm for the data bit line and a memory cell $C_{ref}$ for the reference bit line is also included. In the example, these cells are formed by a floating-gate transistor whose drain is connected to the associated bit line. Their gate is connected to a word line W1. Transistors M1 and M2 form ground connections of the data and reference bit lines and are provided to discharge the bit lines before any read or write access to the memory. These transistors are controlled by a reset signal Reset.

When the memory cell Cm is addressed in read mode, the data bit line Bl and the reference bit line $Bl_{ref}$ are first selected to be connected to a read device 1 by a multiplexer circuit MUX. Then, the word line or lines are selected. These selections are made by a decoding circuit (not shown) which provides selection signals to the multiplexer circuit and appropriate voltage levels to the word lines. The multiplexer 2 may be of a type known in the art and will not be described in detail herein. Nonetheless, it may include a set of selection switch transistors to act as short-circuits or, on the contrary, as open circuits, depending on the logic level of a corresponding selection signal.

The multiplexer MUX is used to connect a selected data bit line Bl to a data input $E_D$ of the corresponding reading device 1. The multiplexer MUX further connects a corresponding reference bit line to a reference input $E_R$ of the read device. In practice, several reading devices 1 may be used, enabling read access or write access to several bit lines simultaneously. It is thus possible to have 8, 10, 12 or 16 or 32 reading devices 1, for example, and the same number of multiplexers in the memory circuit.

The memory cells are selected in read mode by the application of a read voltage to their gate by the corresponding word line. In the example, the cell to be read and the reference cell have their gates connected to the same word line W1. The general structure of a reading device according to the invention includes a differential amplifier 2, a read current generator GEN, precharging circuits $PCH_{MTX}$ and $PCH_{REF}$ and current/voltage converters $C_{IV_D}$ et $C_{IV_R}$.

The differential amplifier 2 gives the information Dout representing the state of the cell selected in read mode. That is, whether it is programmed or not programmed depending on the voltage levels applied to its inputs MTX and REF. The input MTX of the amplifier 2 is connected to the output $S_D$ of the current/voltage converter $C_{IV_D}$ connected at an input $E_D$ of the reading device to the selected data bit line Bl.

The other input REF of the amplifier 2 is connected to the output $S_R$ of a current/voltage converter $C_{IV_R}$ connected by the input $E_R$ to the bit line $Bl_{ref}$. The read current generator GEN has a current mirror structure to generate a reference current $I_R$ on the selected reference bit line and a current $I_D$ equal to a fraction of this reference current on the selected data bit line. Thus, $I_R=K*I_D$, where k may, for example, take values ranging from 1.5 to 4, depending on the characteristics of the transistors used in the current mirror structure. The current generator includes a first arm connected to the data output node $S_D$ of the converter $C_{IV_D}$ and a second arm connected to the data output $S_R$ of the converter $C_{IV_R}$.

According to the present invention, the reading device 1 furthermore includes a circuit for precharging each of the inputs of the amplifier 2 to a precharging voltage. The precharging voltage is an intermediate voltage between the precharging voltage of the bit lines and the two levels of the logic supply voltage Vdd. The reading device according to the present invention thus includes a first precharging circuit $PCH_{MTX}$ of the data input MTX of the amplifier 2 and a second precharging circuit $PCH_{REF}$ of the reference input REF of the amplifier.

The first precharging circuit is connected between the logic supply voltage Vdd and the output $S_D$. It is controlled by a logic signal SON. When it is activated, it brings the output $S_D$, and hence the input MTX of the amplifier, to a precharging voltage Vbias2 by the injection of a precharging current Ipch. The second precharging circuit is connected between the logic supply voltage Vdd and the output $S_R$. It is controlled by the logic signal SON. When it is activated, it brings the output $S_R$, and hence the input REF of the amplifier, to a precharging voltage Vbias2 by the injection of a precharging current Ipch.

If the read current generator is activated during the precharging, it will make the outputs $S_D$ and $S_R$ rise to the level of the logic supply voltage. The precharging circuits could compensate for this effect, but with over-consumption. For this reason, the read generator is controlled by a logic signal MIR and the precharging circuits by a logic signal SON. This inhibits the read current generator during the precharging phase. These logic signals are generated internally to the reading device by a control logic circuit 5. As such, in a precharging phase the read current generator is deactivated and the precharging circuits are activated.

Thus, in the following phase of evaluation, the current generator is activated and the precharging circuits are deactivated. This control logic circuit includes a circuit or means 50 for detecting the level of the input $E_R$ connected to the selected reference bit line $Bl_{ref}$ and a logic circuit or means 51 that gives the logic signals MIR and SON as a function of the output KRl of the detection means 50. The principle of this detection will be explained further below.

Figure 2:
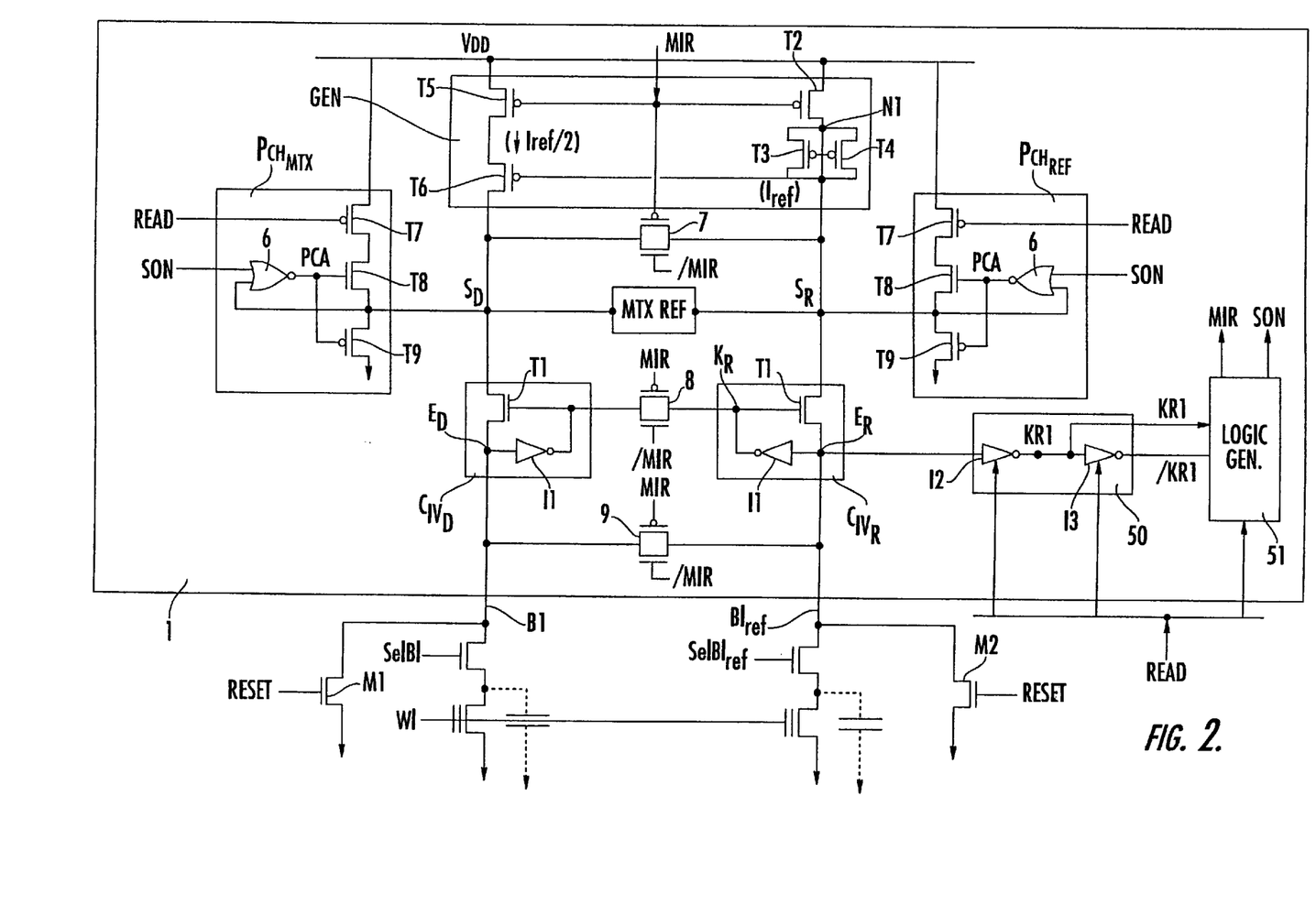
FIG. 2 is a more detailed schematic diagram of the reading device of FIG. 1.

A detailed schematic diagram of an exemplary embodiment of the various circuits of the reading device 1 is shown in FIG. 2. The read current generator GEN has two arms with P type MOS transistors. The first arm includes a selection switch transistor T2 connected between the power supply voltage Vdd of the integrated circuit and a node N1. The first arm also includes two parallel-connected transistors T3 and T4 between the diode N1 and the output $S_R$. They are mounted as current mirrors with their gates and sources connected in common.

When the selection switch transistor T2 is activated, transmitting the power supply voltage Vdd to the node N1, the reference read current $I_R$ is obtained. This current is primarily a function of the characteristics of the reference cell and the reference bit line. The voltage at the gates and sources connected in common is built up to a level $V_{REF}$. The output $S_R$ of the converter and, hence, the input REF of the differential amplifier are built up to this voltage level.

The second arm includes a selection switch transistor T5 and a transistor T6 series-connected between the power supply voltage Vdd of the integrated circuit and the output $S_D$. The transistor T6 has its gate controlled by the gate-source connection of the transistors T3 and T4 of the first arm. If the transistors T3, T4 and T6 are identical, a data read current $I_D$ equal to $I_R/k$ is provided when the selection switch transistor T5 is on and brings the voltage Vdd to the drain of the transistor T6. In the illustrated embodiment, k may be less than or equal to 2, depending on the level of the logic supply voltage Vdd.

The voltage at the output $S_D$ of the converter, and therefore at the input MTX of the amplifier, gets built up to a voltage level that is a function of the state of the memory cell selected in read mode on the data bit line. If it is programmed, it absorbs little or no current and this level builds up to Vdd. If it is erased, it draws a strong current, i.e., more than can be supplied by the current generator, and this voltage level falls down near 0.

Each of the current/voltage converters $C_{IV_D}$ and $C_{IV_R}$, in a known way and in its simplest embodiment, includes a negative feedback loop formed by a transistor T1, a precharging transistor Tp (not shown) and an inverter I1. The transistor T1 is an N-type MOS transistor. The drain d of the transistor T1 gives the output of the converter ($S_D$, $S_R$). The source s of the precharging transistor T1, connected at an input to the converter ($E_D$, $E_R$), is looped back to the gate g of the precharging transistor T1 through the inverter I1. This sets up a feedback control loop imposing the precharging voltage Vbias1 close to 1 volt at the inputs $E_D$, $E_R$ of the converter.

The characteristics (W/L dimensions and threshold voltage) of the transistor T1 and those of the transistors forming the inverter I1 define the value of the precharging voltage Vbias1 that the converter tends to impose on its input. The level of this precharging voltage Vbias1 is set up so that the cells of the bit line connected at the input of the converter cannot get programmed in the read phases.

Each of the bit lines is thus precharged to the precharging voltage Vbias1 by the corresponding current/voltage converter, which performs the function of precharging and voltage limitation on these lines. The precharging circuits are identical. If the precharging circuit is taken on the data side, it has two transistors T7 and T8 series-connected between the power supply voltage Vdd and the output $S_D$ of the corresponding current/voltage converter. The transistor T7 may be a P-type MOS transistor and the transistor T8 may be an N-type MOS transistor.

The transistor T7 is preferably controlled by a read control signal Read. This signal enables the application of the supply voltage Vdd to the drain of the transistor T8 only when there is a read cycle (signal Read active at "0" in the example). The transistor T8 has its source connected to the data output $S_D$. It is controlled at its gate by an analog signal PCA given by a logic gate circuit 6 receiving the logic signal SON at one input, the other input being connected to the output $S_D$.

The negative feedback loop (T1, I1) thus defines the low precharging threshold of the nodes $S_D$ and $S_R$, namely Vbias1 in a range of about one volt. In the illustrated embodiment, the circuit 6 is formed by a NOR gate. The logic signal SON is such that, at the low logic level "0," it activates the precharging circuit and, at the high level "1," it prevents it from working.

Thus, the command PCA of the transistor T8 is such that, when the signal SON is active ("0"), the transistor T8 is on so long as the voltage level at the data output $S_D$ is not sufficient. That is, the voltage level at the data output $S_D$ is lower than the precharging voltage Vbias2. In practice, this precharging voltage is close to the ideal resting level of the amplifier to optimise the reading speed (i.e., about 1.5 volts). This then gives a very fast switch-over of the amplifier into one state or the other in the evaluation phase. The value of this precharging voltage is defined by the characteristics of the different transistors of the precharging circuit, namely the transistors T7 and T8 and the transistors forming the circuit 6.

Preferably, the precharging circuit has another transistor T9 to draw the output $S_D$ towards ground if the voltage at this output overshoots. This may be due to couplings or the sequencing of the different control signals. The transistor T9 may be a P-type MOS transistor controlled at its gate by the signal PCA. The logic control circuit 5 generates the logic signals MIR and SON used to activate (or not activate) the read current generator and the precharging circuits.

It has been seen that it is necessary to activate the read current generator GEN only after the stopping of the precharging of the inputs of the amplifier according to the present invention. This is done to not lose the benefit of the precharging. The problem lies between the end-of-precharging phase and the time when the converters $C_{IV_D}$ et $C_{IV_R}$ are activated. The node $S_D$ is isolated because the data bit line is precharged. If the read generator were to be active during the precharging, it could draw the inputs on the data side and the reference side of the amplifier to the level of the logic supply voltage Vdd depending on the sequencing operations of the different control signals. This is because the memory cells to be read and the reference cells are not selected in the precharging phase. It would therefore not be possible to obtain the precharging of the inputs of the amplifier to an intermediate level according to the invention.

Hence, in the read cycle there is a precharging phase and an evaluation phase. In the precharging phase, the circuits for precharging the inputs of the amplifier ($PCH_{MTX}$, $PCH_{REF}$) are activated. These circuits inject current Ipch to build up the voltage at the output of the converters, thus enabling the operation of these circuits. As such, the precharging of the bit lines ($C_{IV_D}$, $C_{IV_R}$) at the precharging voltage Vbias1 is ensured.

When the precharging phase is terminated, the outputs $S_D$ et $S_R$ are insulated from the inputs $E_D$ and $E_R$, and are therefore highly sensitive to any disturbance. The outputs are precharged to Vbias2 (about 1.5 volts) and the inputs are precharged to Vbias1 (about 1 volt).

In the following phase of evaluation, the precharging circuits are stopped and the read current generator is activated. Advantageously, an internal detection circuit or means is provided to make the read device pass from the precharging phase to the evaluation phase. This is done to avoid dependency on the different variations of the charging parameters due to the conditions of operation and the characteristics of the method of manufacture, and to follow the variations in charge in the bit lines selected in the read mode.

The logic control circuit 5 of the read device thus detects stopping conditions on a signal affected by the precharging phase and of generating logic signals MIR and SON. Several internal signals may be used to make this detection. In one embodiment of the invention, and as shown in FIGS. 1 and 2, the stopping conditions are detected from the voltage level at the input $E_D$ of a converter of the read device, associated with the reference bit line. Thus, there is a very fast and very reliable detection of the start of the discharging of the reference bit line by the reference cell, indicating that the bit line precharging phase is over.

Indeed, it has been seen that, when the data bit line Bl and reference bit line $Bl_{ref}$ selected are precharged to the voltage Vbias1 by the associated current/voltage converter, the transistors T1 are off thus, the outputs $S_D$ and $S_R$ of the converters and the circuits downstream from the converters (precharging circuits, current generator, amplifier) are isolated from the inputs $E_D$ and $E_R$ and therefore the bit lines. The voltage at the outputs $S_D$ and $S_R$ continues to build up to the level Vbias2 because of the circuits for precharging the inputs of the amplifier.

When the word line W1 corresponding to the cell to be read is selected (by the decoding circuit), the reference cell conducts current. This discharges the parasitic capacitance of the associated bit line (capacitance is shown with dashed lines in FIGS. 1 and 2)). When the parasitic capacitance of the reference bit line is discharged, the voltage level at the corresponding input of the read device begins to fall. This is detected by the feedback control loop (I1) of the associated current/voltage converter $C_{IV_D}$, causing the transistor T1 of the loop to be made conductive again.

On the data bit line and data input $E_D$ side, it is not certain that current will be consumed. This depends on the state of the cell selected in read mode. Thus, the stopping conditions are detected on the reference bit line side, and it is certain that current will be consumed. The stopping conditions according to the invention then correspond to the combination of two events. First, the converters go into open loop. Second, the memory cells are made conductive. This causes a drop in voltage at the input $E_R$.

Thus, and as shown in FIG. 1, the control logic circuit 5 receives, at its input, the signal available at the reference input node $E_R$ of the read device. It furthermore receives the read control signal Read. The control logic circuit 5 includes a detection circuit or means 50 and a logic circuit or means 51 for generating the control signal MIR. The control signal MIR is applied to the input of the control generator and control signal SON, which activates the circuits for precharging the inputs of the amplifier.

Figure 3:
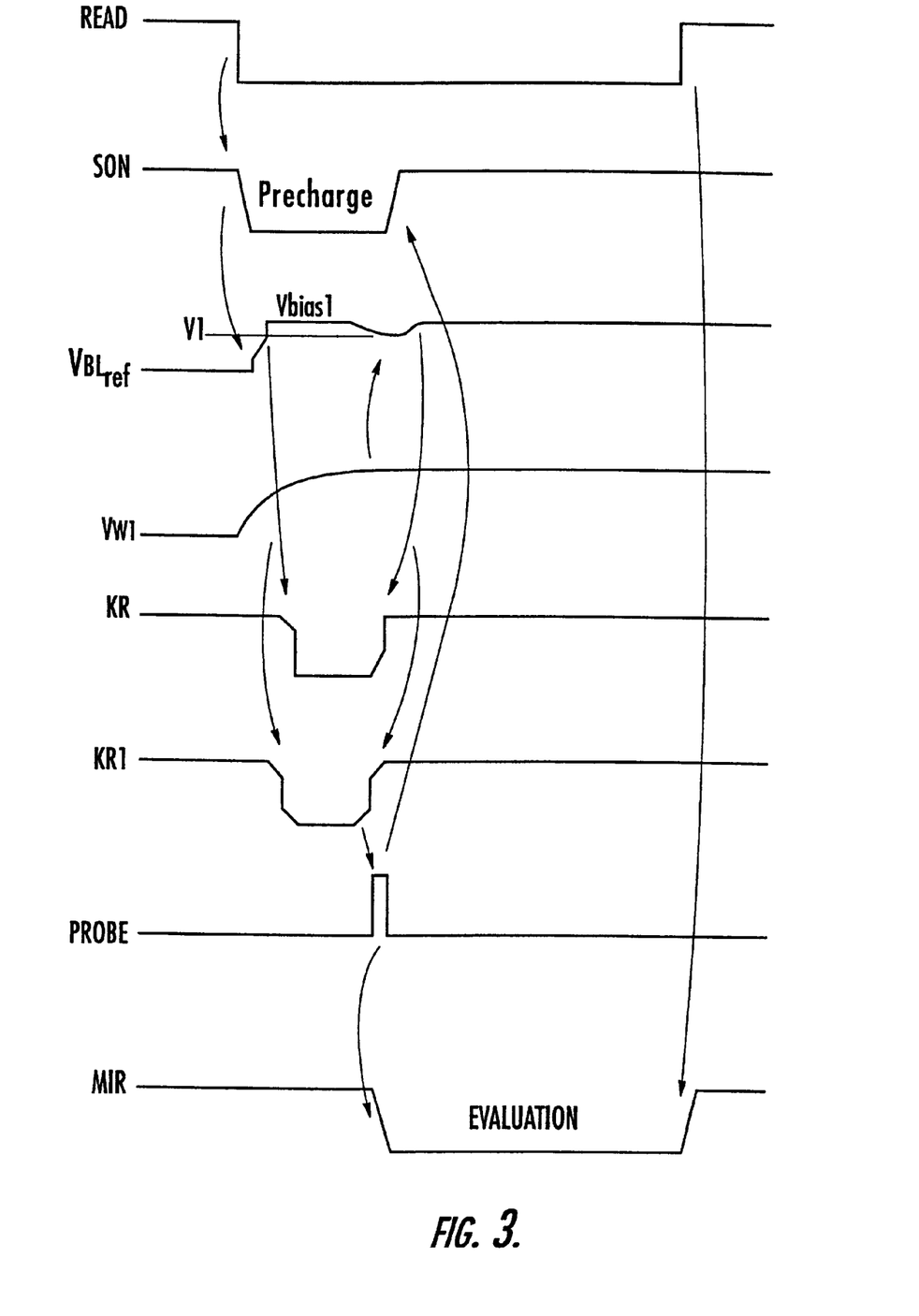
FIG. 3 is a timing diagram of the signals corresponding to the sequencing of the reading device according to the present invention.

The timing diagram of FIG. 3 shows the sequencing of the different signals of the read device during a read cycle. More specifically, this figure shows the read control signal Read, the control signal SON, the voltage $V_{B1_{ref}}$ on the reference bit line, the voltage $V_{W1}$ on the word line, the output signal KR from the inverter I1 of the converter on the reference side, the output signal KR1 from the detection means 50, and the control signal MIR.

During read access to the memory, an access control circuit (not shown) generates a pulse (active on the level "0") on the read control signal Read. The data bit line Bl and reference bit line $Bl_{ref}$ are selected and therefore connected to the the read device. Upon a reception of a pulse of the signal Read, the read control logic circuit 5 makes the control signal SON pass from its passive level (i.e., "1") to its active level (i.e., "0"). Thus, the circuits for precharging the inputs are enabled to be started up.

The circuits for precharging the inputs inject current Ipch so that the data bit line and the reference bit line are precharged to the voltage Vbias1. The voltage $VBl_{ref}$ on the reference bit line rises gradually from 0 to Vbias1 and crosses a threshold of detection V1 of the detection means 50. The detection output signal KR1 switches in one direction, from "1" to "0" in the example. Then it is the inverter I1 of the converter that switches over, from "1" to "0," signifying that the precharging of the bit lines is done and isolating the reference input from the reference output. In particular, the transistor T1 no longer lets current pass. The word line W1 is selected, and the voltage VW1 on this word line rises gradually from 0 to a read bias voltage level (e.g., Vdd). The reference cell becomes conductive as soon as the voltage level $V_{WI}$ is sufficient. It tends to discharge the reference bit line. This results in a drop in voltage on this line since, at this time, there is no current source other than the parasitic capacitance of the line. This drop in voltage is detected by the detection means 50. The detection output signal KR1 switches over in the other direction, i.e., from "0" to "1".

The active edge of this detection, referred to as the trailing edge herein, activates the logic generation means 51, which makes the signal SON rise to "1" and the signal MIR fall to 0. This is to firstly cut off the precharging circuits and, secondly, to activate the read current generator. It can clearly be understood from the timing diagram that the detection means 50 must detect the drop in voltage on the bit line before the inverter I1 of the converter. If not, the converter would go back into action, causing the level to rise on the bit line. As such, there would be a risk that the stopping conditions would never be detected.

An exemplary embodiment of the detection means is shown in detail in FIG. 2. In this embodiment, the detection means 50 includes two series-connected inverters I2 and I3, used to provide the detection signal KR1 and its complementary signal /KR1 to the logic means 51 of the control logic circuit 5. The inverter I2 is sized to switch over before the inverter I1 of the converter. The control signals SON and MIR are brought to their inactive level by the end of the read cycle (Read at 1 in the example)).

The logic means 51 may include a pulse generator, such as the pulse PROBE shown in FIG. 3, activated by the active edge of the detection, namely by the leading edge "0" to "1" of the signal KR1. The logic means 51 may furthermore include logic gates to generate the signals SON and MIR, corresponding to the timing diagram of FIG. 3, as a function of the read control signal Read and of this pulse.

As shown in FIG. 2, equalizing means may be included to balance the two sides (i.e., the data side and the reference side) of the amplifier of the read device. This improves the switch-over speed of the amplifier in the evaluation phase. This is obtained by providing for passgate circuits. One or more of these circuits may be used. For example, a first passgate circuit 7 is may be provided between the two output nodes $S_D$ and $S_R$. A second passgate circuit 8 may be provided between the outputs of the inverters I1 of the feedback control loops. Also, a third passgate circuit 9 may be provided between the inputs $E_D$ and $E_R$ of the converters. When activated, these passgate circuits short-circuit the corresponding nodes, which are therefore brought to the same voltage level. These circuits must therefore be disabled upon passage to the evaluation phase. Thus, they are controlled by the control signal MIR and its complementary signal /MIR.

One method of reading according to the invention with precharging of the inputs of the amplifier to an intermediate voltage level is provided. The intermediate level is between the bit line precharging level and the logic supply voltage Vdd level. Equalization of the different internal nodes of the reading device thus enables a self-sequencing of the reading phase. Furthermore, the amplifier, as soon as it is activated by the control signal MIR, will very quickly go to the output state corresponding to the cell to be read. Thus, a significant amount of time is gained in the reading operation. In practice, it has been possible to obtain read access times of less than 15 nanoseconds, using a read device according to the present invention made with 0.35 micron HCMOS technology.

That which is claimed is:

1. A reading device for an integrated circuit memory comprising:
   a first current-to-voltage converter having an input connected by a data bit line to a memory cell, said first current-to-voltage converter precharging the data bit line to a first precharging voltage in a precharging phase;
   a second current-to-voltage converter having an input connected by a reference bit line to a reference cell, the second current-to-voltage converter precharging the reference bit line to the first precharging voltage in the precharging phase;
   a differential amplifier having a first input connected to an output of the first current-to-voltage converter and a second input connected to an output of the second current-to-voltage converter;
   a read current generator for providing a current on each of said data bit and reference bit lines and enabling data to be provided at an output of the reading device in an evaluation phase; and
   a charging circuit for precharging the first and second inputs of the differential amplifier to a second precharging voltage between the first precharging voltage and a supply voltage during the precharging phase.

2. The reading device according to claim 1 wherein the read current generator receives a control signal deactivating said read current generator during the precharging phase and activating said read current generator during the evaluation phase.

3. The reading device according to claim 1 wherein the second precharging voltage is about 1.5 volts.

4. The reading device according to claim 1 further comprising an equalizing circuit connected to at least one of said differential amplifier, said first current-to-voltage converter, and said second current-to-voltage converter for equalizing corresponding internal nodes of the reading device, said equalizing circuit being controlled by at least one control signal activating said equalizing circuit in the precharging phase and deactivating said equalizing circuit in the evaluation phase.

5. The reading device according to claim 4 wherein said equalizing circuit comprises a passgate circuit connected between the first and second inputs of said differential amplifier.

6. The reading device according to claim 4 wherein said equalizing circuit comprises a passgate circuit connected between the inputs of said first and second current-to-voltage converters.

7. The reading device according to claim 4 wherein each of said first and second current-to-voltage converters comprises a transistor connected between the input and the output thereof and an inverter connected between the input and a gate of said transistor; and wherein said equalizing circuit comprises a passgate circuit connected between the gates of the transistors of the first and second current-to-voltage converters.

8. The reading device according to claim 1 comprising a detection circuit for detecting a passage from the precharging phase to the evaluation phase.

9. The reading device according to claim 8 wherein said second current-to-voltage converter comprises a transistor connected between the input and the output thereof and an inverter connected between the input and a gate of said transistor; and wherein said detection circuit detects a voltage drop at the input of the second current-to-voltage converter precharged to the first precharging voltage to cause the reading device to pass from the precharging phase to the evaluation phase.

10. The reading device according to claim 9 wherein said detection circuit comprises an inverter to detect the voltage drop before said inverter of said second current-to-voltage converter.

11. A reading device for an integrated circuit memory comprising:
   a first precharge circuit having an input connected to a data bit line and precharging the data bit line to a first precharging voltage in a precharging phase;
   a second precharge circuit having an input connected to a reference bit line and precharging the reference bit line to the first precharging voltage in the precharging phase;
   a differential amplifier having a first input connected to an output of the first precharge circuit and a second input connected to an output of the second precharge circuit;
   a read current generator for providing a current on each of said data bit and reference bit lines and enabling data to be provided at an output of the reading device in an evaluation phase; and
   a charging circuit for precharging the first and second inputs of the differential amplifier to a second precharging voltage different that the first precharging voltage during the precharging phase.

12. The reading device according to claim 11 wherein said first and second precharge circuits comprise current-to-voltage converters.

13. The reading device according to claim 11 wherein the second precharging voltage is between the first precharging voltage and a supply voltage.

14. The reading device according to claim 11 wherein the read current generator receives a control signal deactivating said read current generator during the precharging phase and activating said read current generator during the evaluation phase.

15. The reading device according to claim 11 further comprising an equalizing circuit connected to at least one of said differential amplifier, said first precharge circuit, and said second precharge circuit for equalizing corresponding internal nodes of the reading device, said equalizing circuit being controlled by at least one control signal activating said equalizing circuit in the precharging phase and deactivating said equalizing circuit in the evaluation phase.

16. The reading device according to claim 15 wherein said equalizing circuit comprises a passgate circuit connected between the first and second inputs of said differential amplifier.

17. The reading device according to claim 15 wherein said equalizing circuit comprises a passgate circuit connected between the inputs of said first and second precharge circuits.

18. The reading device according to claim 11 comprising a detection circuit for detecting a passage from the precharging phase to the evaluation phase.

19. The reading device according to claim 18 wherein said second precharge circuit comprises a transistor connected between the input and the output thereof and an inverter connected between the input and a gate of said transistor; and wherein said detection circuit detects a voltage drop at the input of the second precharge circuit precharged to the first precharging voltage to cause the reading device to pass from the precharging phase to the evaluation phase.

20. The reading device according to claim 19 wherein said detection circuit comprises an inverter sized to detect the voltage drop before said inverter of said second precharge circuit.

21. An integrated circuit memory comprising:
   a memory cell;
   a reference cell;
   a reading device comprising
      a first precharge circuit having an input connected by a data bit line to said memory cell, said first precharge circuit precharging the data bit line to a first precharging voltage in a precharging phase,
      a second precharge circuit having an input connected by a reference bit line to said reference cell, the second precharge circuit precharging the reference bit line to the first precharging voltage in the precharging phase,
      a differential amplifier having a first input connected to an output of the first precharge circuit and a second input connected to an output of the second precharge circuit,
      a read current generator for providing a current on each of said data bit and reference bit lines and enabling data to be provided at an output of the reading device in an evaluation phase, and
      a charging circuit for precharging the first and second inputs of the differential amplifier to a second precharging voltage different that the first precharging voltage during the precharging phase.

22. The integrated circuit memory according to claim 21 wherein said first and second precharge circuits comprise current-to-voltage converters.

23. The integrated circuit memory according to claim 21 wherein the second precharging voltage is between the first precharging voltage and a supply voltage.

24. The integrated circuit memory according to claim 21 wherein the read current generator receives a control signal deactivating said read current generator during the precharging phase and activating said read current generator during the evaluation phase.

25. The integrated circuit memory according to claim 21 further comprising an equalizing circuit connected to at least one of said differential amplifier, said first precharge circuit, and said second precharge circuit for equalizing corresponding internal nodes of the reading device, said equalizing circuit being controlled by at least one control signal activating said equalizing circuit in the precharging phase and deactivating said equalizing circuit in the evaluation phase.

26. The integrated circuit memory according to claim 25 wherein said equalizing circuit comprises a passgate circuit connected between the first and second inputs of said differential amplifier.

27. The integrated circuit memory according to claim 25 wherein said equalizing circuit comprises a passgate circuit connected between the inputs of said first and second precharge circuits.

28. The integrated circuit memory according to claim 21 comprising a detection circuit for detecting a passage from the precharging phase to the evaluation phase.

29. The integrated circuit memory according to claim 28 wherein said second precharge circuit comprises a transistor connected between the input and the output thereof and an inverter connected between the input and a gate of said transistor; and wherein said detection circuit detects a voltage drop at the input of the second precharge circuit precharged to the first precharging voltage to cause the reading device to pass from the precharging phase to the evaluation phase.

30. The integrated circuit memory according to claim 29 wherein said detection circuit comprises an inverter sized to detect the voltage drop before said inverter of said second precharge circuit.

31. A method for reading data from an integrated circuit memory comprising:
- precharging a data bit line connected to an input of a first precharge circuit to a first precharging voltage in a precharging phase;
- precharging a reference bit line connected to an input of a second precharge circuit to the first precharging voltage in the precharging phase;
- providing a current on each of the data bit and reference bit lines to enable the data to be provided in an evaluation phase; and
- precharging first and second inputs of a differential amplifier to a second precharging voltage during the precharging phase, the first input of the differential amplifier being connected to an output of the first precharge circuit and the second input of the differential amplifier being connected to an output of the second precharge circuit.

32. The method according to claim 31 wherein the first and second precharge circuits comprise current-to-voltage converters.

33. The method according to claim 31 wherein the second precharging voltage is between the first precharging voltage and a supply voltage.

34. The method according to claim 31 wherein the current is provided by a read current generator.

35. The reading device according to claim 34 wherein the read current generator receives a control signal deactivating the read current generator during the precharging phase and activating the read current generator during the evaluation phase.

* * * * *